United States Patent
Mukhopadhyay et al.

(10) Patent No.: US 11,050,420 B2
(45) Date of Patent: *Jun. 29, 2021

(54) BOOTSTRAP DIODE CIRCUITS

(71) Applicant: TEXAS INSTRUMENTS INCORPORATED, Dallas, TX (US)

(72) Inventors: Rajarshi Mukhopadhyay, Allen, TX (US); Nathan Schemm, Rowlett, TX (US); Xiaonan Wang, Beijing (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/879,231

(22) Filed: Jan. 24, 2018

(65) Prior Publication Data

US 2018/0183437 A1 Jun. 28, 2018

Related U.S. Application Data

(62) Division of application No. 14/733,655, filed on Jun. 8, 2015, now Pat. No. 9,941,876.

(51) Int. Cl.
*H03K 17/74* (2006.01)
*G05F 1/46* (2006.01)
*H03K 5/24* (2006.01)

(52) U.S. Cl.
CPC .............. *H03K 17/74* (2013.01); *G05F 1/46* (2013.01); *H03K 5/2472* (2013.01); *H03K 2217/0081* (2013.01)

(58) Field of Classification Search
CPC ........ H03K 17/74; H03K 5/2472; H03G 1/00; H03G 11/00; H03G 11/02; H03G 2201/10; H01L 29/7821; H01L 29/866; H01L 2924/12035; G05F 1/46
USPC ......................................................... 327/502
See application file for complete search history.

(56) References Cited

U.S. PATENT DOCUMENTS

| | | | | |
|---|---|---|---|---|
| 5,336,383 A * | 8/1994 | Allington | ......... | G01N 27/44773 204/458 |
| 6,617,906 B1 * | 9/2003 | Hastings | .................. | H03K 5/08 327/309 |
| 7,145,316 B1 * | 12/2006 | Galinski, III | ......... | H02M 3/156 323/288 |
| 7,710,167 B2 * | 5/2010 | Bernacchia | ......... | H02M 7/5388 327/108 |
| 2005/0140345 A1 | 6/2005 | Iwabuki et al. | | |
| 2010/0259233 A1 * | 10/2010 | Cheng | ................. | H02M 3/1588 323/265 |

(Continued)

OTHER PUBLICATIONS

Siegal, Bernie "An Introduction to Diode Thermal Measurements"; Thermal Engineering Associates, Inc.; Draft #6; 2009; 16 pages.

(Continued)

*Primary Examiner* — Patrick C Chen
(74) *Attorney, Agent, or Firm* — Ebby Abraham; Charles A. Brill; Frank D. Cimino

(57) ABSTRACT

In described examples, bootstrap diode circuits include a first diode having a first diode input coupled to a voltage supply and a first diode output. Described bootstrap diode circuits additionally include a second diode having a second diode input coupled to the first diode output and a second diode output and a plurality of zener diodes coupled in series. The series-coupled zener diodes are further coupled in parallel with the second diode.

14 Claims, 12 Drawing Sheets

(56) References Cited

U.S. PATENT DOCUMENTS

| | | | | |
|---|---|---|---|---|
| 2010/0259235 A1* | 10/2010 | Ozalevli | ............... | G05F 1/56 |
| | | | | 323/274 |
| 2010/0259238 A1* | 10/2010 | Cheng | ............... | H02M 1/36 |
| | | | | 323/282 |
| 2014/0217959 A1* | 8/2014 | Chen | ............... | H02J 7/0052 |
| | | | | 320/107 |
| 2015/0188328 A1* | 7/2015 | Abouda | ............... | H03K 17/063 |
| | | | | 123/478 |
| 2015/0349640 A1* | 12/2015 | Ito | ............... | H02M 3/158 |
| | | | | 323/271 |

OTHER PUBLICATIONS

Fairchild; "Design and Application Guide of Bootstrap Circuit for High-Voltage Gate-Drive IC"; AN-6076; Fairchild Semiconductor Corporation; Dec. 18, 2014; 13 pages.

Learning About Electronics; "What is a Fast Recovery Diode?"; <http://www.learningaboutelectronics.com/Articles/Fast-recovery-diode.php; retrieved Dec. 8, 2015; 4 pages.

* cited by examiner

BOOTSTRAP DIODE CIRCUITS

CROSS-REFERENCE TO RELATED APPLICATION

This application is a divisional of U.S. patent application Ser. No. 14/733,655 filed Jun. 8, 2015, which is hereby fully incorporated herein by reference for all purposes.

BACKGROUND

This relates generally to bootstrap circuits, and more particularly to bootstrap diode circuits.

Gate driver circuits used to drive the gates of high-side and low-side N-channel MOSFETS ("N-MOSFETS") typically include a bootstrap circuit to provide a floating power supply for the gate of the high-side N-MOSFET. The floating power supply provides a voltage level sufficient to bias the gate of the high-side N-MOSFET relative to the source thereby causing the high-side N-MOSFET to turn on (i.e., conduct current). In some applications, turning on the high-side N-MOSFET causes a power supply to be coupled to a load.

Bootstrap circuits are often implemented using a capacitor that is charged via current supplied through a bootstrap diode in series with a bootstrap resistor connecting to a low-side voltage supply. When the capacitor is sufficiently charged, the high-side N-MOSFET is turned on causing the bootstrap diode to be subjected to a reverse bias voltage commensurate with the magnitude of the voltage rating of the power supply. To ensure proper operation, the bootstrap diode technology is chosen to block the reverse bias voltage. By way of example, a bootstrap diode device used in an application having a 100 volt (V) power supply must be able to block a reverse bias voltage of 100V.

Unfortunately, many applications require a 200V power supply or have to withstand 200V of supply surges. However, the development of new technology to support a single-chip gate driver integrated circuit having a bootstrap diode rated to withstand 200V can be both costly and time consuming. Although single-chip gate driver circuits having a bootstrap diode rated for 100V are commercially available, a bootstrap diode rated to withstand a maximum reverse bias voltage of 100V will get damaged when exposed to a reverse bias voltage of 200V and, thus, cannot be reliably used to operate with a 200V power supply. As a result, bootstrapping a gate driver circuit on an integrated circuit (IC) that may be subject to a high reverse bias voltage (e.g., >200V) typically requires extra pins on the IC and components (e.g., a 200V diode) external to the IC, which raises system complexity and cost.

SUMMARY

The methods and apparatus disclosed herein relate generally to bootstrap circuits and more particularly, to bootstrap diode circuits. Some example bootstrap diode circuits disclosed herein are disposed on an integrated circuit and include a first diode having a first diode input coupled to a voltage supply and a first diode output. Example bootstrap diode circuits disclosed herein additionally include a second diode having a second diode input coupled to the first diode output and a second diode output. Example bootstrap diodes circuits further include a plurality of zener diodes coupled in series and the series-coupled zener diodes are coupled in parallel with the second diode. In some examples, a first area associated with the second diode is six times greater than a second area associated with the first diode.

Some example bootstrap diode circuits disclosed herein additionally include a MOSFET coupled in parallel with the first diode. In some examples, the plurality of series-coupled zener diodes are a first plurality of zener diodes and the bootstrap diode circuit further includes a second plurality of series-coupled zener diodes. The second plurality of zener diodes, in some examples, is coupled in parallel with the first diode.

Further example bootstrap diode circuits disclosed herein include a first MOSFET coupled in parallel with the first diode and a second MOSFET coupled in parallel with the second diode. In some such examples, the first MOSFET and the second MOSFET are N-MOSFETS. In some such examples, the first MOSFET is an N-MOSFET and the second MOSFET is a P-MOSFET.

In some examples, the bootstrap diode circuit disclosed herein also includes a voltage limiting circuit coupled between a gate terminal of the first MOSFET and a source terminal of the first MOSFET. In some such examples, the voltage limiting circuit includes a zener diode coupled in series with a resistor.

Some example bootstrap diode circuits disclosed herein also include a boost driver circuit having a voltage sensing circuit, a comparator circuit and a charge pump circuit. In some such examples the voltage sensing circuit includes a first input coupled to the first output of the gate driver circuit and a first voltage sensing output and a second voltage sensing output. In some such examples, the comparator circuit disclosed herein includes a first comparator input and a second comparator input coupled to the first voltage sensing output of the voltage sensing circuit and the second voltage sensing output of the voltage sensing circuit, respectively. The charge pump circuit includes a first charge pump input and a second charge pump input coupled to a first comparator output and a second comparator output, respectively. The charge pump circuit also includes a first charge pump output coupled to a gate of the MOSFET.

Some example methods disclosed herein to drive a switching device include charging a charging device coupled to a switching device, and turning on the switching device by delivering charge from the charging device to the switching device, to cause a reverse bias voltage to be applied to a bootstrap diode circuit. In some such examples, the bootstrap diode circuit includes first and second diodes coupled in series, and the first and second diodes having respective reverse bias voltage ratings. Some such example methods also include blocking, with the first and second diodes, the reverse bias voltage, the magnitude of the reverse bias voltage exceeding the respective reverse bias voltages of the first and second diodes. The magnitude of the reverse bias voltage can be twice as large as the reverse bias voltage rating of the first and second diodes. In some examples the magnitude of the reverse bias voltage is equal to or less than a maximum junction voltage of an integrated circuit on which the switching device is disposed. In some examples, the reverse bias voltage ratings of the first and second diode are equal.

In some example methods the second diode is coupled to an output of the bootstrap diode circuit and the reverse bias voltage is applied at the output of the bootstrap diode circuit. In some such example methods, a first area associated with the first diode is six times smaller than a second area associated with the second diode. In yet further example methods, the second diode is coupled to an output of the bootstrap diode circuit, the reverse bias voltage is applied at the output of the bootstrap diode circuit, and the bootstrap diode circuit further includes a plurality of zener diodes coupled in series. In some such example methods, the plurality of zener diodes are coupled in parallel with the second diode and the method further includes clamping, with the plurality of zener diodes, the voltage across the second diode to a magnitude less than or equal to the reverse bias voltage rating of the second diode.

In further example methods disclosed herein, the switching device is a first switching device, and the bootstrap diode circuit further includes a second switching device coupled in parallel with the first diode. Some such further example methods additionally include turning on the second switching device when charging the charging device. In some example methods, the switching device is a first switching device, and the bootstrap diode circuit further includes a second switching device coupled in parallel with the first diode, and a third switching device coupled in parallel with the second diode, and the example methods further include turning on the second switching device and the third switching device when charging the charging device.

In some examples, the bootstrap diode circuit further includes a first plurality of zener diodes coupled in series and the first plurality of zener diodes being coupled in parallel with the first diode. The bootstrap diode circuit can also include a second plurality of zener diode coupled in series and the second plurality of zener diodes are coupled in parallel with the second diode. In some such examples, the method additionally includes clamping, with the first plurality of zener diodes, the voltage across the first diode to a magnitude less than or equal to the reverse bias voltage rating of the first diode, and clamping, with the second plurality of zener diodes, the voltage across the second diode to a magnitude less than or equal to the reverse bias voltage rating of the second diode.

In further examples disclosed herein, the switching device is a first switching device, and the diode circuit further includes a second switching device coupled in parallel with the first diode, and a third switching device coupled in parallel with the second diode. In some such examples, the method also includes turning on the second switching device and the third switching device when charging the charging device. In some such examples, the second switching device and the third switching device are MOSFETS. In some examples, the second switching device is an N-MOSFET and the third switching device is a P-MOSFET.

In yet other example methods, the second switching device is a MOSFET and the bootstrap diode circuit further includes a voltage limiting circuit coupled between the gate of the MOSFET and the source of the MOSFET. The voltage limiting circuit includes a zener diode coupled in series with a resistor. In some such examples, the method further includes limiting the gate to source voltage applied to the MOSFET to a threshold value. In some examples, the bootstrap diode circuit also includes a MOSFET coupled in parallel with the first diode and the method further includes sensing a gate driver voltage at an output of a gate driver circuit, comparing the gate driver voltage to a reference voltage, and turning the MOSFET off when the gate driver voltage is determined to be greater than the reference voltage. In further examples, the method includes determining that the gate driver voltage becomes less than the reference voltage for a threshold amount of time, and after the threshold amount of time, turning the MOSFET on.

Example switch controllers disposed on integrated circuits are also disclosed herein. An example switch controller includes a switch gate driver circuit to control first and second switches, and a bootstrap circuit coupled to the gate driver circuit. The bootstrap circuit includes a diode circuit having a first diode and a second diode coupled in series. The diode circuit is to block a reverse bias voltage having a magnitude that exceeds a first reverse bias voltage rating of the first diode and that exceeds a second reverse bias voltage rating of the second diode. In some examples, the magnitude of the reverse bias voltage is equal to or less than a maximum junction voltage of the integrated circuit. In some examples, the magnitude of the reverse bias voltage is twice as large as the first reverse bias voltage rating and the second reverse bias voltage rating. In some examples, the reverse bias voltage is applied to the output of the second diode and the area of the second diode is six times greater than the area of the first diode.

In further examples, the reverse bias voltage is applied to an output of the second diode, and the diode circuit of the switch controller further includes a plurality of series-coupled zener diodes that are coupled in parallel with the second diode. In yet further examples, the reverse bias voltage is applied to an output of the second diode, and the diode circuit of the switch controller further includes a MOSFET coupled in parallel with the first diode.

In some examples disclosed herein, the plurality of zener diodes is a first plurality of zener diodes, and the diode circuit includes a second plurality of zener diodes coupled in series, the second plurality of zener diodes being coupled in parallel with the first diode. In addition, the example diode circuit further can include a first MOSFET coupled in parallel with the first diode and a second MOSFET coupled in parallel with the second diode. In some such examples, the first MOSFET and the second MOSFET are N-MOSFETS. In yet further examples, the first MOSFET is an N-MOSFET and the second MOSFET is a P-MOSFET.

In some examples disclosed herein, the diode circuit further includes a first MOSFET coupled in parallel with the first diode, a second MOSFET coupled in parallel with the second diode, and a voltage limiting circuit coupled between the gate of the first MOSFET and the source of the first MOSFET. The example voltage limiting circuit includes a zener diode coupled in series with a resistor. In further examples, the diode circuit further includes a boost driver circuit having a voltage sensing circuit, a comparator circuit and a charge pump circuit. The voltage sensing circuit senses a gate driving voltage at an output of the gate driver circuit and the comparator circuit compares the sensed gate driving voltage to a reference voltage. The charge pump circuit turns on the MOSFET coupled in parallel with the first diode based on the comparison made by comparator circuit. Some example switch controllers disclosed herein additionally include a level shifter to shift an input voltage supplied to the gate driver circuit from a first voltage level to a second voltage level.

These and other example methods, apparatus, systems and articles of manufacture to implement the bootstrap diode circuit (also referred to as a diode circuit) are described in greater detail hereinbelow.

BRIEF DESCRIPTION OF THE DRAWINGS

Wherever possible, the same reference numbers will be used throughout the drawing(s) and accompanying written description to refer to the same or like parts, elements, etc.

DETAILED DESCRIPTION OF EXAMPLE EMBODIMENTS

Certain examples are shown in the above-identified figures and described in detail below. In describing these examples, like or identical reference numbers may be used to identify common or similar elements. The figures are not necessarily to scale, and certain features and certain views of the figures may be shown exaggerated in scale or in schematic for clarity and/or conciseness. Although the following discloses example methods and apparatus, such methods and apparatus are merely illustrative and should not be considered as limiting. The example circuits described herein may be implemented using discrete components, integrated circuits (ICs), or any combination thereof.

Additionally, any form of logic may be used to implement portions of apparatus or methods herein. Logic may include, for example, circuit implementations that are made exclusively in dedicated hardware (e.g., circuits, transistors, logic gates, hard-coded processors, programmable array logic (PAL), application-specific integrated circuits (ASICs), etc.), exclusively in software, exclusively in firmware, or some combination of hardware, firmware, and/or software. Accordingly, while the following describes example methods and apparatus, persons of ordinary skill in the art will readily appreciate that the examples are not the only way to implement such apparatus.

Figure 1:
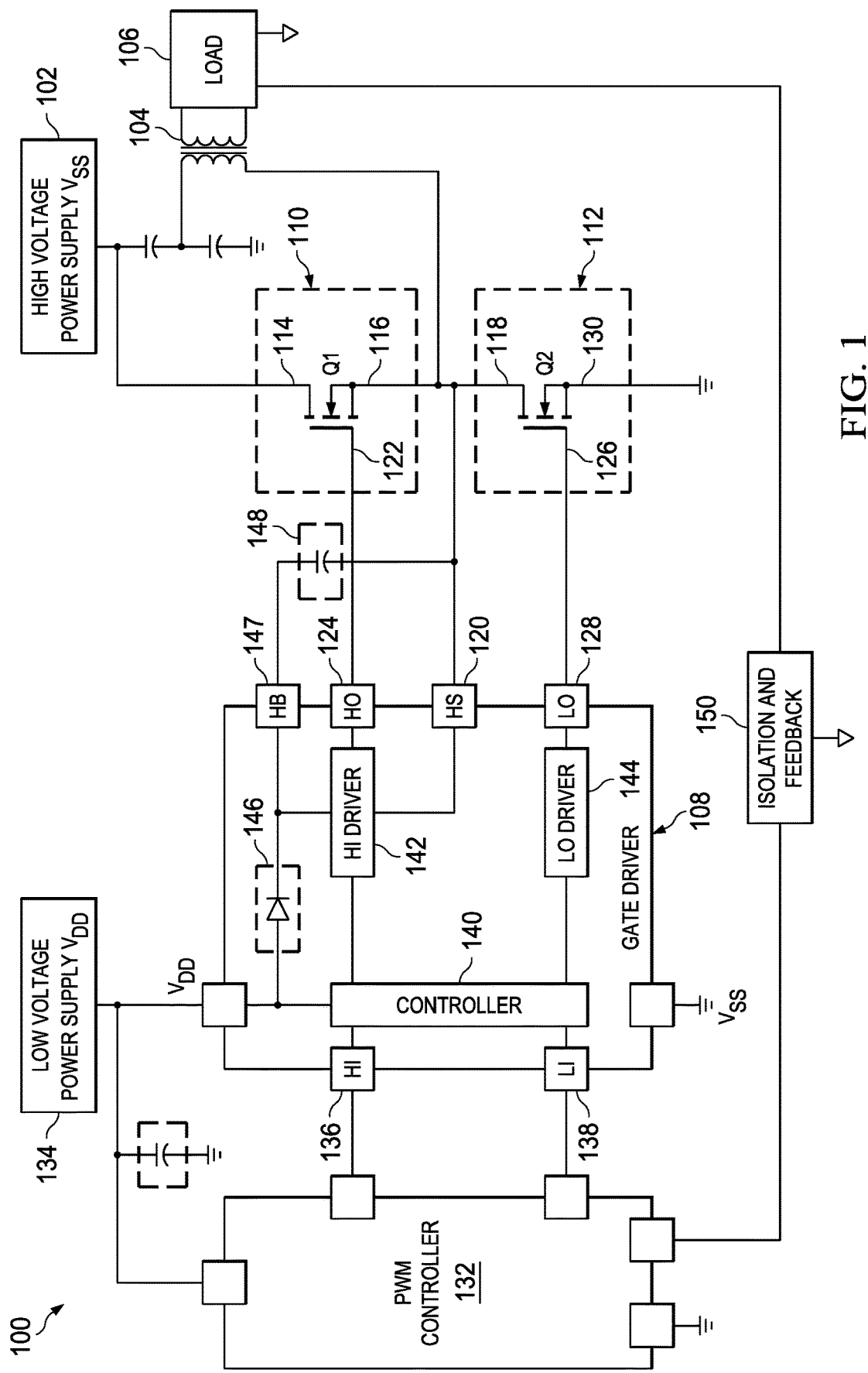
FIG. 1 is a schematic diagram of an example power conversion system having an example integrated circuit on which an example gate driver circuit and an example bootstrap diode circuit are disposed.

FIG. 1 is a block diagram representative of an example power conversion system 100 that down-converts an example high voltage (e.g., 200V) direct current power supply 102 to any desired voltage via an example transformer 104 coupled to an example load 106. An example gate driver circuit 108 disposed on an integrated circuit controls the flow of current through an example high-side MOSFET ("MOSFET Q1") 110 and an example low-side MOSFET ("MOSFET Q2") 112 to permit the supply of voltage from the high voltage power supply 102 to the load 106. In some examples, an example drain terminal 114 of the MOSFET Q1 110 is coupled to the high voltage power supply 102 and an example source terminal 116 of the MOSFET Q1 110 is coupled to an example drain terminal 118 of the MOSFET Q2 112 and is further coupled to an example first output ("HS output") 120 of the gate driver circuit 108. An example gate terminal 122 of the MOSFET Q1 110 is coupled to an example second output ("HO output") 124 of the gate driver circuit 108. An example gate terminal 126 of the second MOSFET Q2 112 is coupled to an example third output ("LO output") 128 of the gate driver circuit 108 and an example source terminal 130 of the second MOSFET Q2 112 is coupled to ground.

An example pulse width modulation controller 132 provides necessary signaling to an example high-side input ("HI input") 136 of the example gate driver circuit 108 and an example low-side input ("LI input") 138 of the gate driver circuit 108. The signals supplied by the pulse width modulation controller 132 to the HI input 136 and the LI input 138 are used by an example controller circuit 140 of the gate driver circuit 108 to control an example high-side driver circuit 142 coupled to the example HS output 120, the example HO output 124 and an example low-side driver circuit 144 coupled to the example LO output 128.

In operation, when the example HI input 136 is set to a logic high, the example LI input 138 is set to a logic low and vice versa. Additionally, when the LI input 138 is set to a logic high, the example controller 140 causes the example low-side driver circuit 144 to supply a voltage (e.g., VDD=20 V) to the example LO output 128 which, in turn causes the example gate terminal 126 of the MOSFET Q2 112 to be positively biased relative to the example source terminal 130 of the MOSFET Q2 112 (which is coupled to ground). Positively biasing the gate terminal 126 of the MOSFET Q2 112 relative to the source terminal 130 of the MOSFET Q2 112 causes the MOSFET Q2 112 to turn ON (i.e., begin conducting current). In addition, when the LI input 138 is a logic high, the HI input 136 is a logic low such that the high-side driver circuit 142 drives the HS output 120 and the HO output 124 to zero volts. Because there is an insufficient bias voltage between the gate terminal 122 and the source terminal 116 of the MOSFET Q1 110, the MOSFET Q1 110 is turned OFF. As a result, the high voltage power supply 102 is not coupled to the load 106.

With the example MOSFET Q2 112 turned ON, current flows from an example low voltage direct current power supply VDD 134 through an example bootstrap diode circuit 146 of the example gate driver circuit 108 to an example output ("HB" output") 147. The current then charges an example bootstrap capacitive circuit 148 that is coupled to the example HS output 120 and that is further coupled to the example drain 118 of the MOSFET Q2 112. Provided that the example bootstrap capacitive circuit 148 is charged for a sufficient duration of time, the voltage across the bootstrap capacitive circuit 148 is approximately $V_{DD}-V_{DIODE}$, where $V_{DIODE}$ is equal to the voltage drop across the bootstrap diode circuit 146. Thus, when the MOSFET Q2 112 is turned ON, the MOSFET Q1 110 is turned OFF, the load 106 is uncoupled from the high voltage power supply 102, and the capacitive circuit 148 is charging.

To turn on the example MOSFET Q1 110, the example HI input 136 is set to high and the example controller circuit 140 responds by causing the example high-side driver circuit 142 to supply a voltage signal to the example output HS 120. In some examples, the levels of voltage supplied to the example output HS 120, the example output HO 124 and the example output HB 147 are shifted up by a level shifter (described further below with respect to FIG. 2) to a voltage level that is commensurate with the voltage levels generated by the high voltage power supply 102 and that are present at the example drain terminal 114 and the example source terminal 116 of the MOSFET Q1 110 when the MOSFET Q1 110 is turned ON. The voltage level at the example HB output 147 is equal to the voltage level present at the HS output 120 plus the voltage across the example bootstrap capacitive circuit 148 (e.g., $V_{DD}-V_{DIODE}$). As a result of the difference between the voltage level at the HS output 120 and the voltage level at the HB output 147, the voltage present at the HO output 124 rises thereby biasing the example gate 122 of the MOSFET Q1 110 relative to the example drain 114 of the MOSFET Q1 110 causing the MOSFET Q1 110 to turn ON. As described above, when the MOSFET Q1 110 is ON, the MOSFET Q2 112 is turned OFF. Thus, current flows from the high voltage power supply 102 through the MOSFET Q1 110 to the load 106 via the example transformer 104. In some examples, an isolation and feedback circuit 150 coupled between the load 106 and the pulse width modulation controller 132 operates to isolate the load from the rest of the circuitry and to reduce the effects of feedback.

Figure 2:
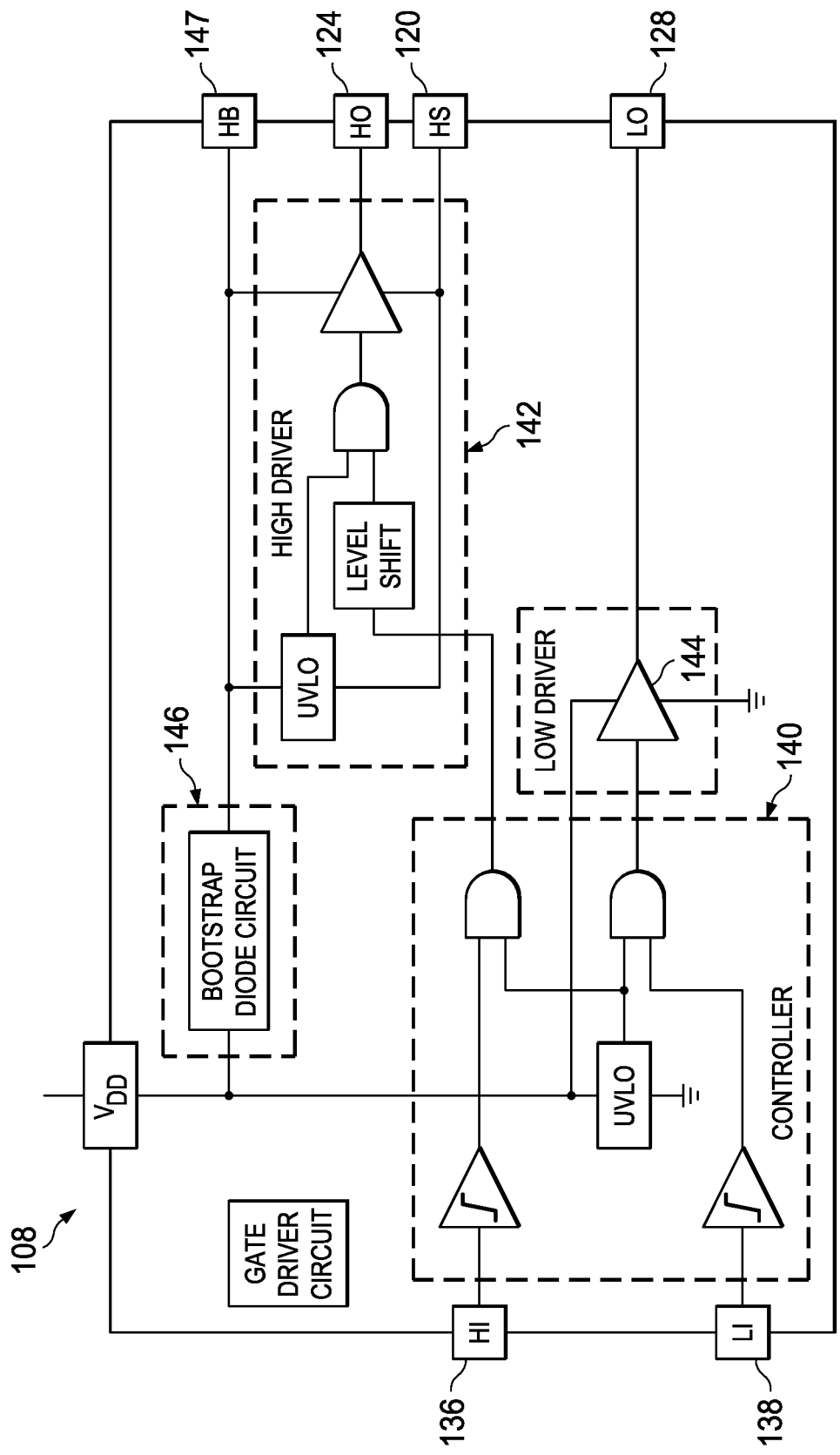
FIG. 2 is a schematic diagram of the example integrated circuit of FIG. 1 illustrating the example gate driver circuit and the example bootstrap diode circuit of FIG. 1.

An example implementation of the example gate driver circuit 108 of FIG. 1 is illustrated in the example circuit diagram of FIG. 2. First example circuitry implementing the example controller circuit 140, second example circuitry implementing the example high driver circuit 142, and third example circuitry implementing the example low driver circuit 144 are depicted in FIG. 2. As illustrated in FIG. 2, the example controller circuit 140 can include example AND gates, an example under voltage detector, and example buffers. As also shown in FIG. 2, the example high driver circuit 142 can include an example AND gate, an example buffer, an example voltage level shifter and an example under voltage detector. As further illustrated in FIG. 2, the example low driver circuit 144 can be implemented using an example buffer. Example circuits to implement the bootstrap diode circuit 146 are depicted in FIGS. 3-11 as described below.

Referring again to FIG. 1, when the example MOSFET Q1 110 turns ON (i.e., begins conducting current), the magnitude of the voltage appearing at the example source 116 of the MOSFET Q1 110 is equal to the magnitude of the voltage (e.g., 200V) supplied by the high voltage power supply 102 causing a reverse bias voltage to be present at the example HB output 147. The magnitude of the reverse bias voltage present at the HB output 147 is equal to the magnitude of the voltage supplied by the high voltage power supply 102 plus the voltage across the bootstrap capacitor circuit 148 ($V_{DD}-V_{DIODEDROP}$). To effectively block the reverse bias voltage and thereby prevent diode breakdown, the bootstrap diode circuit 146 includes circuit components that are capable of withstanding the reverse bias voltage on the order of 200V, as described further below.

One way to ensure that the bootstrap diode circuit is able to withstand the large reverse bias voltage is to ensure that any circuit elements contained in the bootstrap diode circuit are rated to withstand a large reverse bias voltage. For example, single-chip gate driver circuits that are equipped with a bootstrap diode circuit containing a fast diode rated to withstand a 100V reverse bias voltage are commercially available. However, new technology needs to be developed for the manufacture of a single-chip gate driver circuit equipped with bootstrap diodes capable of withstanding a 200V reverse bias voltage and such technology development is both costly and time consuming. Instead, when an application requires a 200V power source, circuit designers couple an external fast diode rated to withstand a 200V reverse bias voltage to an integrated chip containing a gate driver circuit. However, adding external components to an existing integrated chip is a complex and costly solution that adversely impacts the size of the circuit and is generally not preferred.

The example bootstrap diode circuits 146 described herein include circuit components that are configured in a manner that permits the bootstrap diode circuit to withstand a reverse bias voltage having a magnitude greater than the magnitude of the reverse bias voltage that the individual circuit components are rated to withstand. In some examples, the bootstrap diode circuits described herein are capable of withstanding a reverse bias voltage having a magnitude that is equal to or less than a maximum junction voltage rating of the integrated circuit on which the bootstrap diode circuit and the gate driver circuit are built. In some examples, as described further below, the bootstrap diode circuits disclosed herein are capable of withstanding a reverse bias voltage having a magnitude that is twice as large and even four times as large as the reverse bias voltage ratings of the individual circuit components included in the bootstrap diode circuits.

Figure 3:
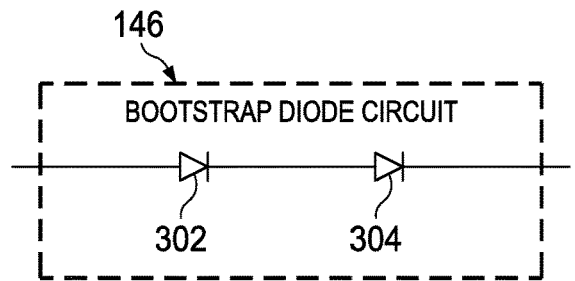
FIG. 3 is a schematic diagram of a first example circuit to implement the bootstrap diode circuit of FIGS. 1 and 2 having an example first diode in series with an example second diode.
Figure 4:
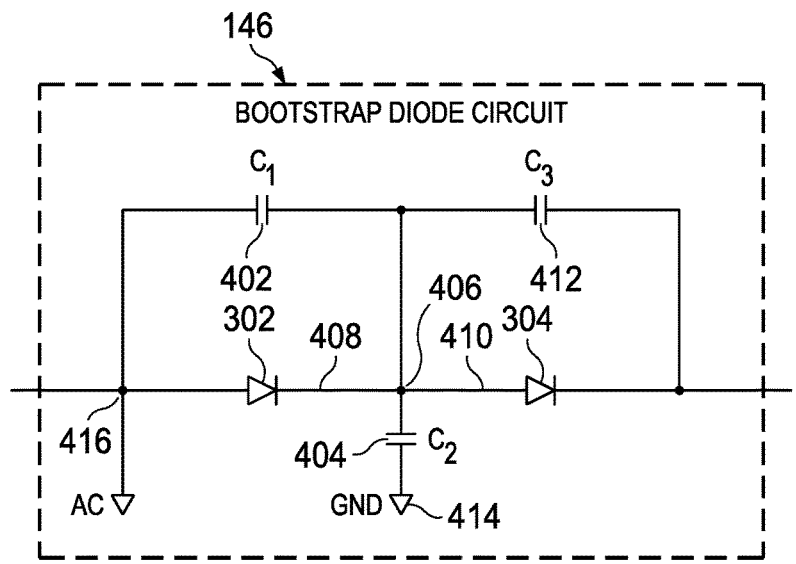
FIG. 4 is a schematic diagram of the example bootstrap diode circuit of FIG. 3 that further illustrates example intrinsic capacitors associated with the example first diode and the example second diode.

As shown in FIG. 3, in some examples, the example bootstrap diode circuit 146 of FIG. 1 includes an example first diode 302 coupled in series with an example second diode 304. In some such examples, the first and second diodes 302, 304 have equal reverse bias voltage ratings and are coupled in series. In some such examples, the first and second diodes have equal reverse bias voltage ratings and the area of the second diode is at least six times larger than the area of the second diode. The first diode 302 and the second diode 304 inherently experience capacitive effects that are illustrated in the schematic diagram of FIG. 4. As shown in FIG. 4, an example first intrinsic capacitor 402 exists in parallel with the first diode 302 and an example second intrinsic capacitor 404 having an example input 406 exists between an example output 408 of the first diode 302 and an example input 410 of the second diode 304. An example third intrinsic capacitor 412 exists in parallel with the second diode 304.

Due to the large capacitance represented by the second intrinsic capacitor 404 and associated with the first diode 302, when the output of the bootstrap diode circuit 146 is subjected to a large reverse bias voltage, the voltage can be unevenly distributed between the first and second diodes 302, 304. As a result, the second diode 304 may experience a greater portion of the reverse bias voltage. To offset this effect, the area of the second diode 304 is increased to a size sufficient to ensure that the capacitance of the third intrinsic capacitor 412 is equal to the sum of the capacitances of the first and second intrinsic capacitors 402, 404. In some such examples, the area occupied by the second diode 304 on the integrated circuit is six times larger than an area occupied by the first diode 302 to achieve the desired capacitance levels and thereby ensure that the reverse bias voltage present at the output of the bootstrap diode circuit 146 is equally distributed among the first diode and second diodes 302, 304. As illustrated in FIG. 4, in some examples, an example output 414 of the second intrinsic capacitor 404 and an example input 416 to the first diode 302 are both coupled to an alternating current ("AC") ground.

Figure 5:
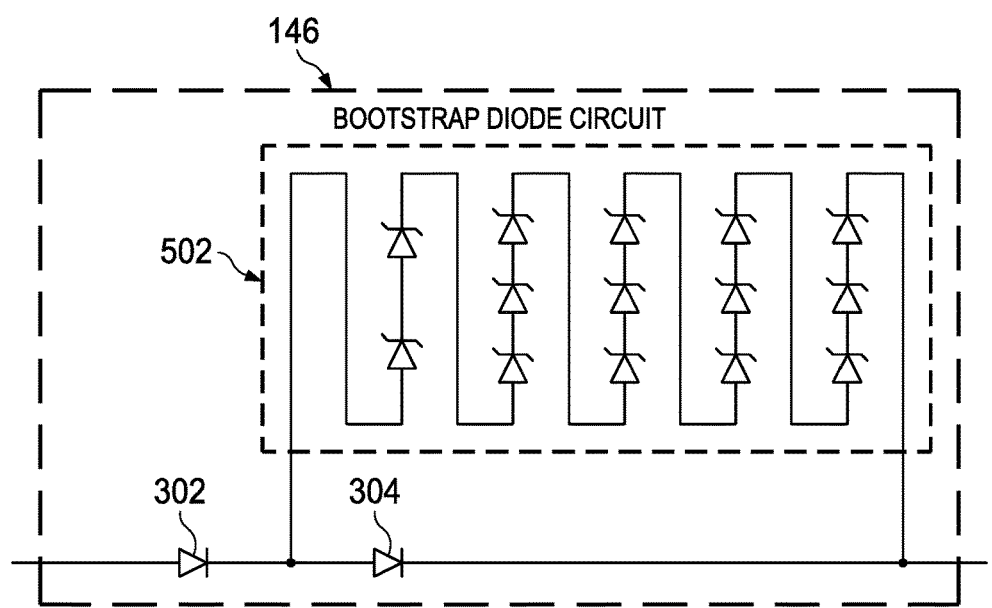
FIG. 5 is a schematic diagram of a second example circuit to implement the bootstrap diode circuit of FIGS. 1 and 2 having an example first diode in series with an example second diode and also having an example plurality of zener diodes.

As shown in FIG. 5, in some examples, the example bootstrap diode circuit 146 of FIG. 1 includes an example first diode 302 coupled in series with an example second diode 304 and a plurality of series-coupled zener diodes 502. In some such examples, the plurality of series-coupled zener diodes 502 are coupled in parallel with the second diode 304 and operate to clamp the voltage across the second diode 304 to a desired voltage level. For example, fourteen zener diodes, each associated with a 7V drop, will clamp the voltage drop across the second diode to 98V.

Figure 6:
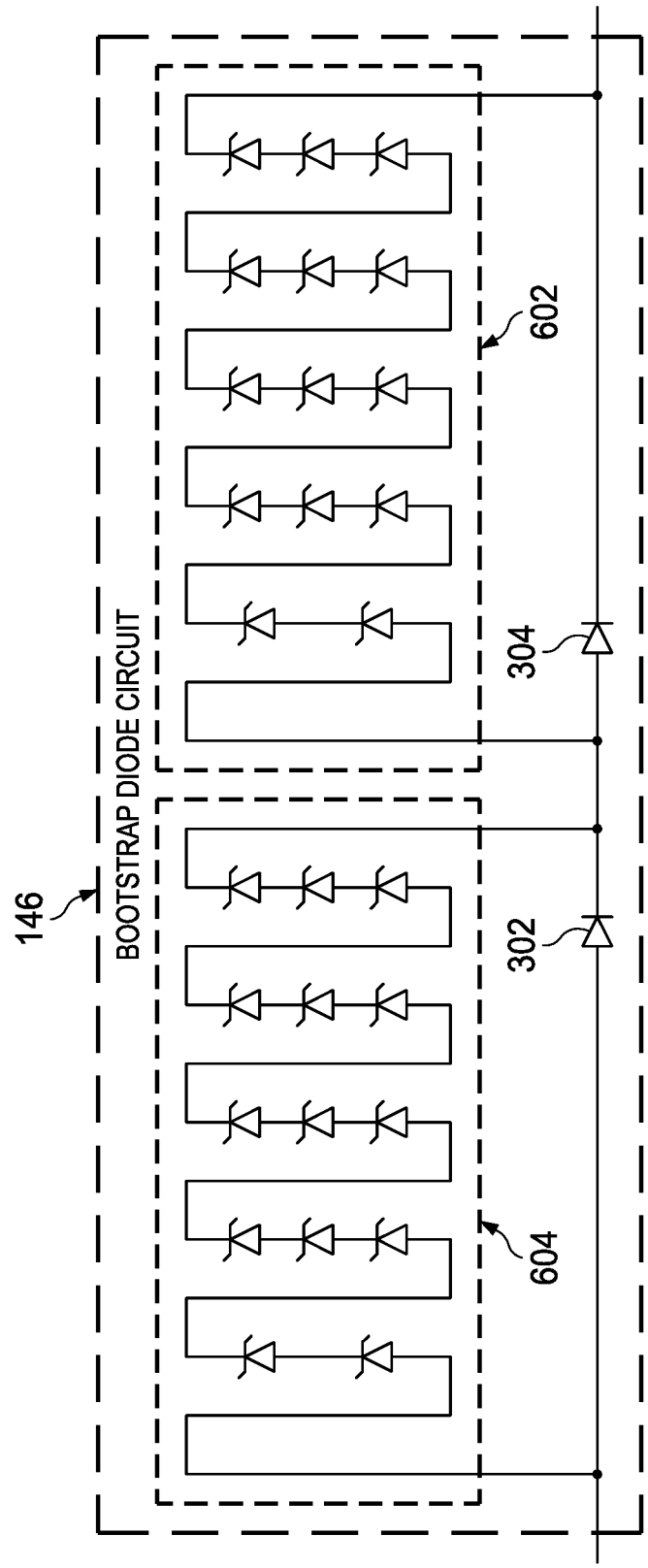
FIG. 6 is a schematic diagram of a third example circuit to implement the bootstrap diode circuit of FIGS. 1 and 2 having an example first diode in series with an example second diode and also having an example first plurality of zener diodes and an example second plurality of zener diodes.

In some examples, the example bootstrap diode circuit 146 of FIG. 1 includes an example first diode 302 coupled in series with an example second diode 304 and an example first plurality of series-coupled zener diodes 602 and an example second plurality of series-coupled zener diodes 604 as illustrated in the schematic diagram of FIG. 6. In some such examples, the first plurality of series-coupled zener diodes 602 are coupled in parallel with the first diode 302 and operate to clamp the voltage across the first diode 302 to a desired voltage level and the second plurality of series-coupled zener diodes 604 are coupled in parallel with the second diode 304 and operate to clamp the voltage across the second diode 304 to a desired voltage level. In such examples, the number and the ratings of the zener diodes included in the first and the second plurality of zener diodes 602, 604 are selected to clamp the voltage across the first and second diodes 302, 304 respectively, to desired levels. In some examples, 14 zener diodes, each rated for 7V, are included in each of the first plurality and the second plurality of zener diodes 602, 604. In some such examples, the number of zener diodes and the active areas of the zener diodes are selected in a manner that results in matched leakage current between the first diode and the parallel combination of the second diode along with the string of zener diodes.

Figure 7:
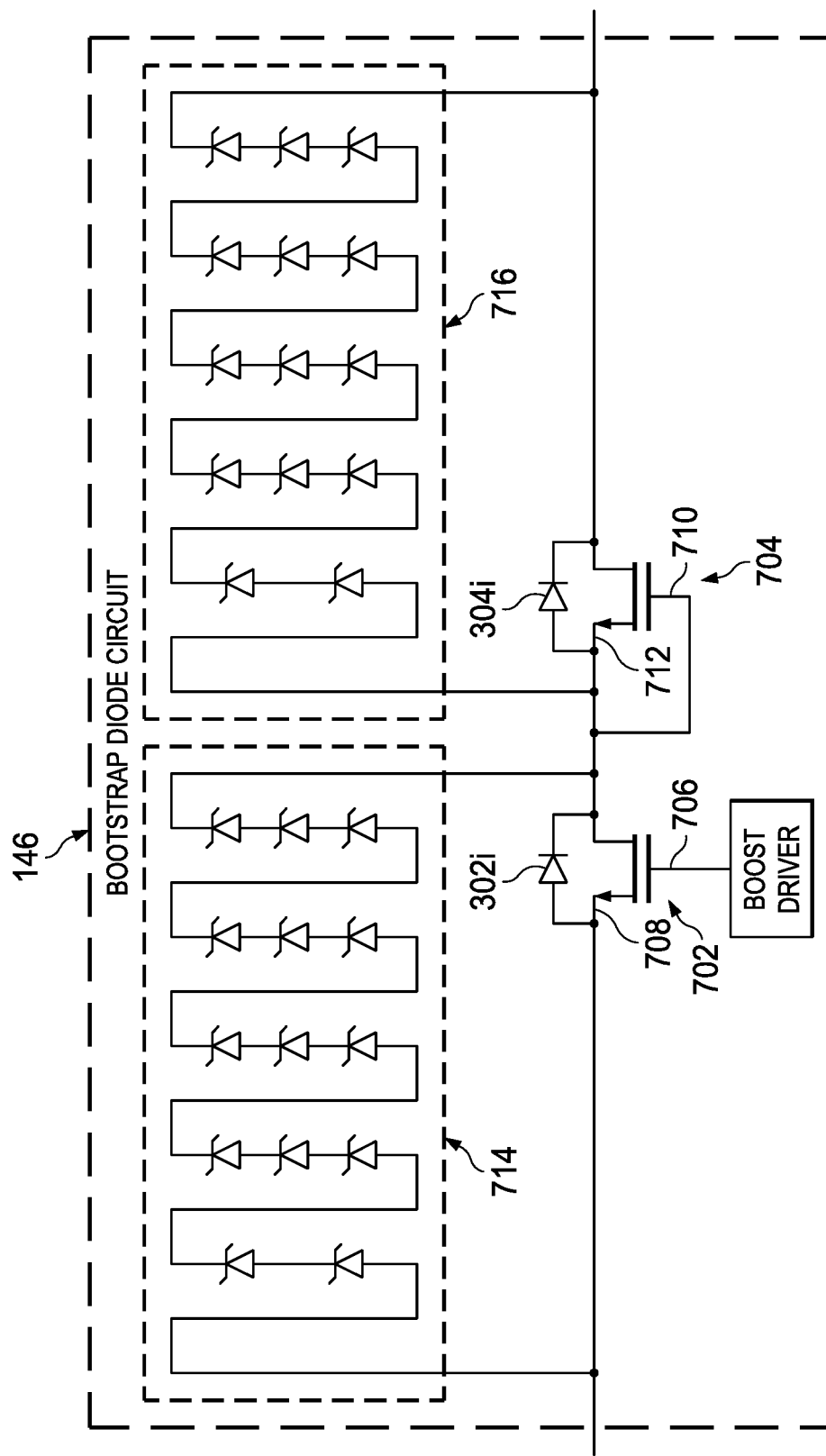
FIG. 7 is a schematic diagram of a fourth example circuit to implement the bootstrap diode circuit of FIGS. 1 and 2 having an example first N-MOSFET associated with an example first intrinsic diode coupled in series with an example second N-MOSFET associated with an example second intrinsic diode and also having an example first and second plurality of zener diodes.

In some examples, the example bootstrap diode circuit 146 of FIG. 1 includes an example first N-MOSFET 702 coupled in series with an example second N-MOSFET 704 as illustrated in the schematic diagram of FIG. 7. In such examples, the first N-MOSFET 702 includes an example first "intrinsic" diode 302i and the second N-MOSFET 704 includes an example second "intrinsic" diode 304i. The first and second intrinsic diodes 302i, 304i are not additional to the first and second N-MOSFETs 702, 704 but are rather an inherent property/feature resulting from the manner in which N-MOSFETs are constructed. In some such examples, when the example MOSFET Q1 110 (see FIG. 1) is turned ON such that the example capacitive circuit 148 (see FIG. 1) is being charged, a voltage level present at an example gate terminal 706 of the first N-MOSFET 702 is positively biased relative to a voltage level present at an example source terminal 708 of the first N-MOSFET 702 thereby causing the first N-MOSFET 702 to turn ON. Thus, the first N-MOSFET 702 operates as a short circuit, such that current does not flow through the first intrinsic diode 302i and no voltage drop is associated with the first intrinsic diode 302i. In some examples, the bias voltage is supplied by a boost driver described further below in connection with FIG. 13.

In addition, an example gate terminal 710 of the example second N-MOSFET 704 is tied to an example source terminal 712 of the second N-MOSFET 704 using the example second intrinsic diode 304i of the second N-MOSFET 704 as the second diode. As a result, current flows through the example second intrinsic diode 304i and charges the example capacitive circuit 148 (see FIG. 1) when the example MOSFET Q1 110 (see FIG. 1) is OFF and the example MOSFET Q2 112 (see FIG. 1) is ON.

When the example MOSFET Q1 110 (see FIG. 1) turns ON, and the MOSFET Q2 112 (see FIG. 1) turns OFF, a reverse bias voltage having a magnitude approximately equal to the voltage supplied by the high voltage power supply 102 (see FIG. 1) minus a voltage associated with one diode drop (e.g., the voltage drop across the example second intrinsic diode 304i) is seen across the example bootstrap diode circuit 146. In some examples, when the MOSFET Q1 110 (see FIG. 1) turns OFF and the MOSFET Q2 112 (see FIG. 1) turns ON, the first N-MOSFET 702 is turned OFF by shorting the example gate terminal 706 of the N-MOSFET 702 and the example source terminal 708. In some examples, the first MOSFET 702 is turned ON and OFF via the boost driver as described below in connection with FIG. 13.

In some examples, the bootstrap diode circuit illustrated in FIG. 7 further includes an example first plurality of zener diodes 714 coupled in series and an example second plurality of zener diodes 716 coupled in series. The first plurality of zener diodes 714 is coupled in parallel with the first N-MOSFET 702 and first intrinsic diode 302i and second plurality of zener diodes 716 is coupled in parallel with the second N-MOSFET 704 and the second intrinsic diode 304i. In some such examples, the first and second pluralities of zener diodes 714, 716 clamp the voltage experienced across the first intrinsic diode 302i and the second intrinsic diode 304i, respectively, to a maximum voltage level thereby reducing the risk that either the first or the second intrinsic diodes 302i, 304i experience breakdown. In some such examples, when the clamping voltage achieved using the first plurality of zener diodes 714 is equal to the clamping voltage achieved using the second plurality of zener diodes 716, any leakage currents associated with the first and second N-MOSFETS 702, 704 tend to be matched thereby further reducing the risk of diode breakdown.

Figure 8:
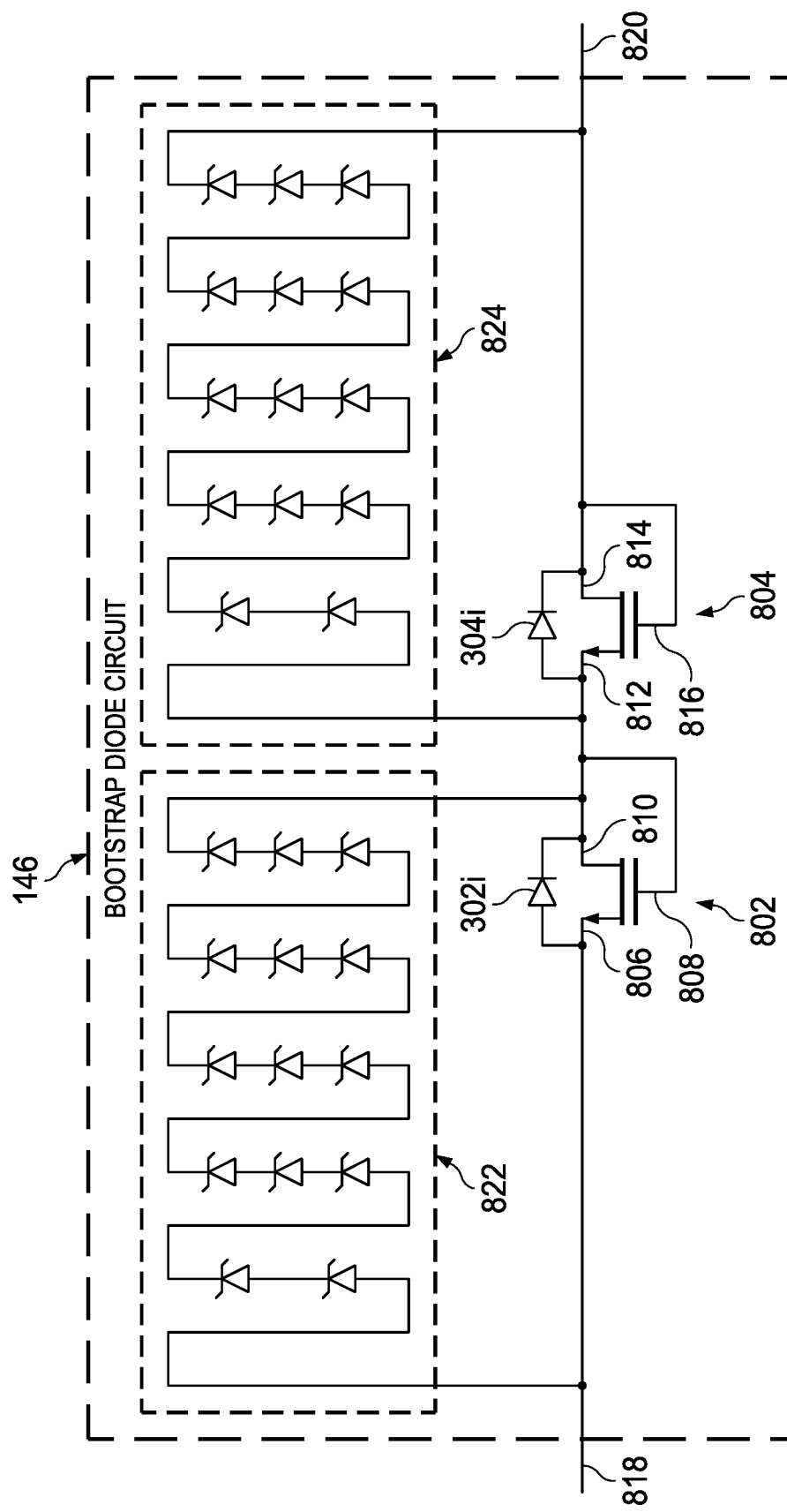
FIG. 8 is a schematic diagram of a fifth example circuit to implement the bootstrap diode circuit of FIGS. 1 and 2 having an example first P-channel MOSFET ("P-MOSFET") associated with an example first intrinsic diode coupled in series with an example second P-MOSFET associated with an example second intrinsic diode and also having an example first and second plurality of zener diodes.

In some examples, the example bootstrap diode circuit of FIG. 1 includes an example first P-MOSFET 802 coupled in series with an example second P-MOSFET 804 as illustrated in FIG. 8. In such examples, the first P-MOSFET 802 includes a first "intrinsic" diode 302 and the second P-MOSFET 804 includes a second "intrinsic" diode 304. The first and second intrinsic diodes 302i, 304i are not additional to the first and second P-MOSFETs 802, 804 but are rather an inherent property/feature caused by the manner in which P-MOSFETs are constructed. An example first drain 806 of the first P-MOSFET 802 is coupled to the low voltage power supply VDD 134 (see FIG. 1) and an example first gate 808 of the first P-MOSFET 802 is coupled to an example first source 810 of the first P-MOSFET 802. An example second drain 812 of the second P-MOSFET 804 is coupled to the first source 810 of the first P-MOSFET 802 and an example second source 814 of the second P-MOSFET 804 is coupled to an example second gate 816 of the second P-MOSFET 804. Coupling the first gate 808 and the second gate 816 to the first source 810 and the second source 814, respectively, causes both the first and second P-MOSFETs 802, 804 to turn OFF (i.e., operate as an open circuit). In this configuration, the first and second intrinsic diodes 302i and 304i operate as two stand-alone diodes in series to conduct current moving from the example low voltage power supply 134 to the example second MOSFET Q2 112 (see FIG. 1) and to block a high reverse voltage present when the first MOSFET Q1 (see FIG. 1) is turned ON. The second P-MOSFET 804 could be turned ON when the first MOSFET Q1 110 (see FIG. 1) turns OFF, the second MOSFET Q2 112 (see FIG. 1) turns ON, and the example capacitor 148 (see FIG. 1) is being charged as the voltage level at the example output HS 120 is at ground potential. When operating in this example manner, any voltage drop across the second P-MOSFET 804 is eliminated because the second P-MOSFET 804 acts as a short circuit.

When the example MOSFET Q1 110 (see FIG. 1) is turned OFF and the example MOSFET Q2 112 (see FIG. 1) is turned ON, the voltage level at an example input 818 of the example bootstrap diode circuit 146 is equal to the voltage level supplied by the low voltage power supply VDD 134 (see FIG. 1) and current flows through the first intrinsic diode 302i and the second intrinsic diode 304i causing a first voltage drop associated with the first intrinsic diode 302i and a second voltage drop associated with the second intrinsic diode 304i. Thus, the voltage at an example output 820 of the bootstrap diode circuit 146 is equal to the voltage level supplied by the low voltage power supply VDD 134 (see FIG. 1) minus two diode voltage drops. When the MOSFET Q1 110 (see FIG. 1) is turned ON and the MOSFET Q2 112 (see FIG. 1) is turned OFF, a reverse bias voltage is delivered to the output 820 of the bootstrap diode circuit 146. The magnitude of the reverse bias voltage is equal to the voltage level supplied by the high voltage power supply 102 (see FIG. 1) minus the voltage drop across the first and the second intrinsic diodes 302i, 304i. Meanwhile, the magnitude of the voltage present at the example gate 808 of the first P-MOSFET 802 is equal to the voltage level supplied by the high voltage power supply 102 (see FIG. 1) divided by two plus the voltage level supplied by the low voltage power supply VDD 134 (see FIG. 1) minus the voltage drop across the first and second intrinsic diode 302i, 304i.

In some examples, the bootstrap diode circuit illustrated in FIG. 8 further includes an example first plurality of zener diodes 822 coupled in series and an example second plurality of zener diodes 824 coupled in series. The first plurality of zener diodes 822 is coupled in parallel with the first P-MOSFET 802 and the first intrinsic diode 302i and the second plurality of zener diodes 824 is coupled in parallel with the second P-MOSFET 804 and the second intrinsic diode 304i. In some such examples, the first and second pluralities of zener diodes 822, 824 clamp the voltage experienced across the first intrinsic diode 302i and the second intrinsic diode 304i, respectively, to a maximum voltage level thereby reducing the risk that either the first and/or the second intrinsic diodes 302i, 304i experience breakdown.

Figure 9:
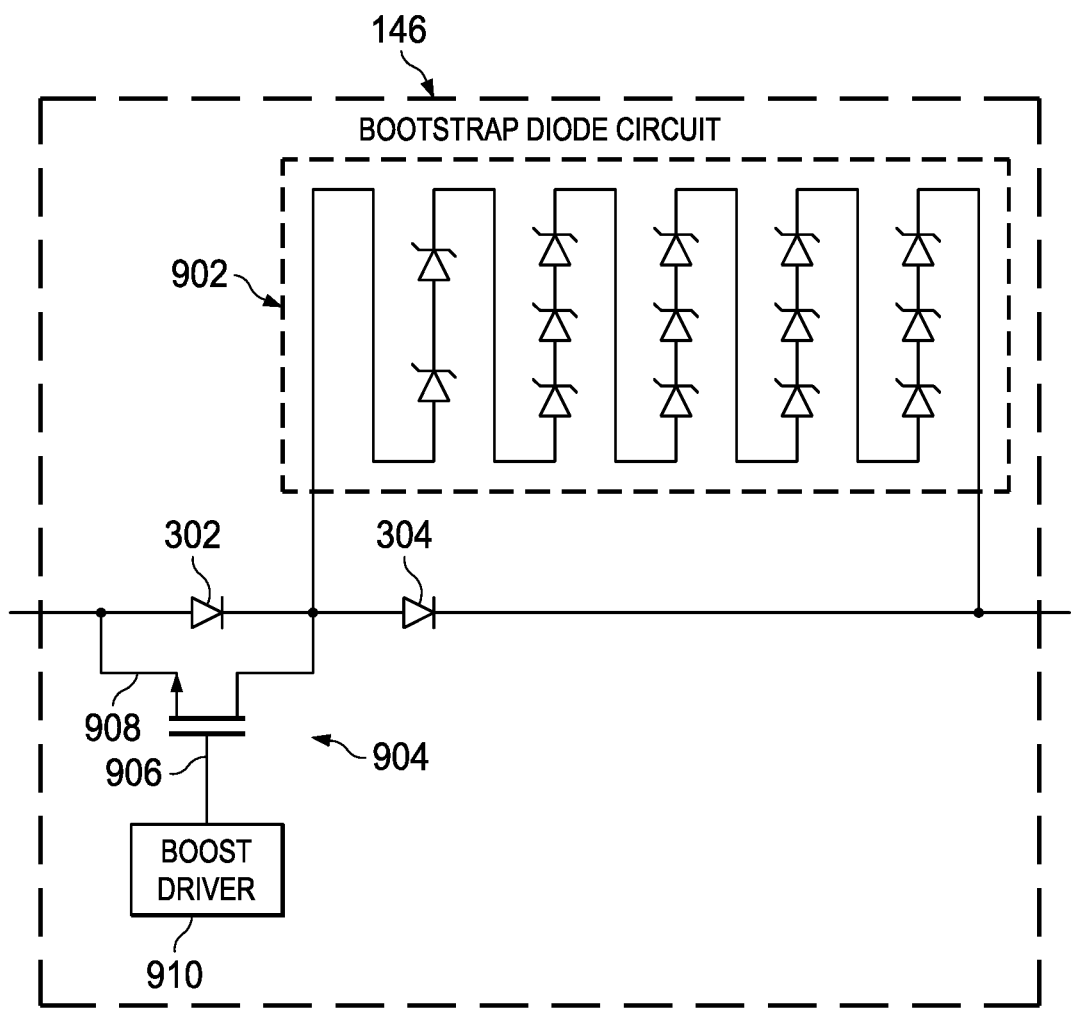
FIG. 9 is a schematic diagram of a sixth example circuit to implement the bootstrap diode circuit of FIGS. 1 and 2 having an example first diode coupled in series with an example second diode and also having an example plurality of zener diodes and an example N-MOSFET driven by an example boost driver circuit.

In some examples, the example bootstrap diode circuit of FIG. 1 includes an example first diode 302 coupled in series with an example second diode 304 and an example plurality of series-coupled zener diodes 902 as illustrated in the schematic diagram of FIG. 9. In some such examples, the plurality of series-coupled zener diodes 902 are coupled in parallel with the second diode 304 and operate to clamp the voltage across the second diode 304 to a desired voltage level. In some such examples, an example N-MOSFET 904 is coupled in parallel with the first diode 302 and is turned ON when the example MOSFET Q1 110 (see FIG. 1) is turned OFF and the example MOSFET Q2 112 (see FIG. 1) is turned ON by biasing a voltage level supplied at an example gate terminal 906 of the N-MOSFET 904 relative to an example source terminal 908 of the N-MOSFET 904. As a result, the first diode 302 is shunted such that there is no forward voltage drop across the first diode. In some examples, the bias voltage is supplied by a boost driver 910 described further below in connection with FIG. 13.

Figure 10:
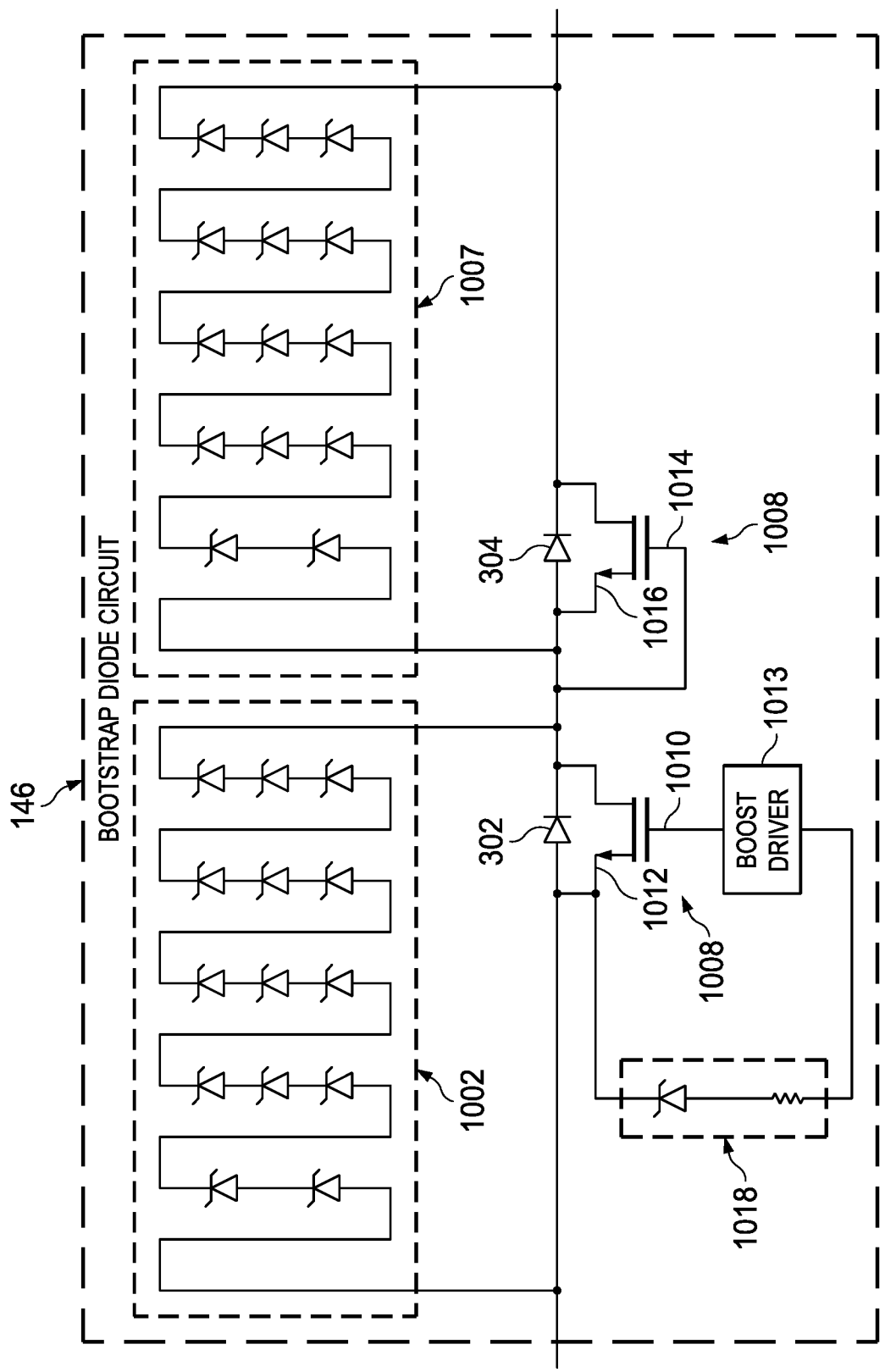
FIG. 10 is a schematic diagram of an seventh example circuit to implement the bootstrap diode circuit of FIGS. 1 and 2 having an example first diode coupled in series with an example second diode, an example first plurality of zener diodes and an example second plurality of zener diodes, and also having an example first N-MOSFET driven by an example boost driver circuit and an example second N-MOSFET.

As shown in FIG. 10, in some examples, the example bootstrap diode circuit 146 of FIG. 1 includes an example first diode 302 coupled in series with an example second diode 304, an example first plurality of series-coupled zener diodes 1002, and an example second plurality of series-coupled zener diodes 1004. In some such examples, the first plurality of series-coupled zener diodes 1002 are coupled in parallel with the first diode 302 and operate to clamp the voltage across the first diode 302 to a desired voltage level and the second plurality of series-coupled zener diodes 1004 are coupled in parallel with the second diode and operate to clamp the voltage across the second diode 304 to a desired voltage level. In some such examples, a first N-MOSFET 1006 is coupled in parallel with the first diode 302 and a second N-MOSFET 1008 is coupled in parallel with the second diode 304. When the example bootstrap capacitive circuit 148 (see FIG. 1) is being charged via the bootstrap diode circuit 146, a level of voltage supplied at an example first gate terminal 1010 of the first N-MOSFET 1006 is biased relative to a level of voltage supplied at an example first source terminal 1012 of the first N-MOSFET 1006. As a result, the first N-MOSFET 1006 turns ON causing the first diode 302 to be shunted. Thus, there is no forward voltage drop across the first diode 302 when current is flowing through the bootstrap diode circuit 146 toward the bootstrap capacitive circuit 148 (see FIG. 1). In some examples, the bias voltage is supplied by a boost driver 1013 described further below in connection with FIG. 13. In some examples, an example second gate terminal 1014 of the second N-MOSFET 1008 is coupled to an example second source 1016 of the second N-MOSFET 1008 thereby causing the second N-MOSFET 1008 to be turned OFF (i.e., current does not flow through the second N-MOSFET 1008 but flows through its associated intrinsic diode (the second intrinsic diode 304*i*)). The second N-MOSFET 1008 ensures a matched leakage current to the first N-MOSFET 1006 when the reverse bias voltage is present at the output of the example bootstrap diode circuit 146. In some examples, an example voltage limiting circuit 1018 is coupled to the source terminal 1012 of the first MOSFET 1006 and includes an example zener diode in series with an example resistor. The zener diode and resistor are sized to ensure that the difference between a voltage present at the gate terminal 1010 and a voltage present at the source terminal 1012 does not exceed a desired threshold value (e.g., 5V). Limiting the difference between the voltage present at the gate terminal 1010 and the source terminal 1012 ensures reliable operation of the first N-MOSFET 1010 during ramp up and ramp down of the example low voltage power supply 134 (see FIG. 1) and when other transient voltages are present due to switching.

Figure 11:
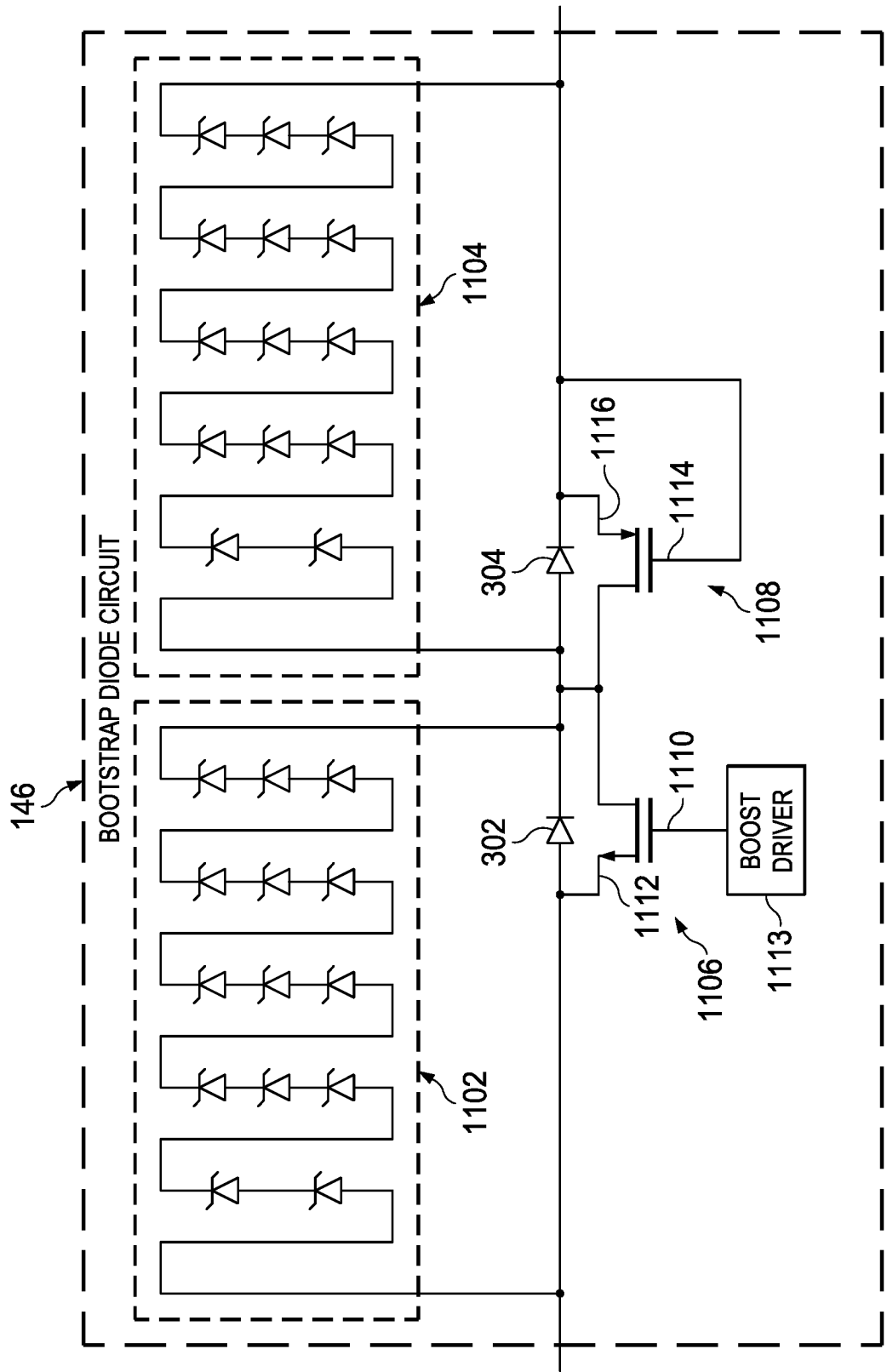
FIG. 11 is a schematic diagram of an eighth example circuit to implement the bootstrap diode circuit of FIGS. 1 and 2 having an example first diode coupled in series with an example second diode, an example first plurality of zener diodes and a second plurality of zener diodes, an example N-MOSFET driven by an example boost driver circuit and also having an example P-MOSFET.

In some examples, the example bootstrap diode circuit 146 of FIG. 1 includes an example first diode 302 coupled in series with an example second diode 304, an example first plurality of series-coupled zener diodes 1102, and an example second plurality of series-coupled zener diodes 1104, as illustrated in the schematic diagram of FIG. 11. The first plurality of zener diodes 1102 is coupled in parallel with the first diode 302 and the second plurality of zener diodes 1104 is coupled in parallel with the second diode 304. In some such examples, the first and second pluralities of zener diodes 1102, 1104 clamp the voltage experienced across the first diode 302 and the second diode 304, respectively, to a maximum voltage level thereby reducing the risk that either the first and/or the second diodes 302, 304 experience breakdown. In some examples, the first diode 302 is also coupled in parallel with an example N-MOSFET 1106 and the second diode 304 is also coupled in parallel with an example P-MOSFET 1108. In some such examples, a level of voltage supplied to an example gate terminal 1110 of the N-MOSFET 1106 is biased relative to a level of voltage supplied to an example source terminal 1112 of the N-MOSFET 1106. As a result, the first N-MOSFET 1106 turns ON causing the first diode 302 to be shunted. Thus, there is no forward voltage drop across the first diode 302 when current is flowing through the bootstrap diode circuit 146 toward the example bootstrap capacitive circuit 148 (see FIG. 1). In some examples, the bias voltage is supplied by a boost driver 1113 described further below in connection with FIG. 13. In some examples, an example gate terminal 1114 of the P-MOSFET 1108 is tied to an example source terminal 1116 of the P-MOSFET 1108 causing the P-MOSFET 1108 to be turned OFF while the associated intrinsic diode (e.g., the second intrinsic diode 304*i*) operates much like the second example diode 304 of FIG. 3 and/or FIG. 6, (i.e., current does not flow through the P-MOSFET 1108.)

Figure 12:
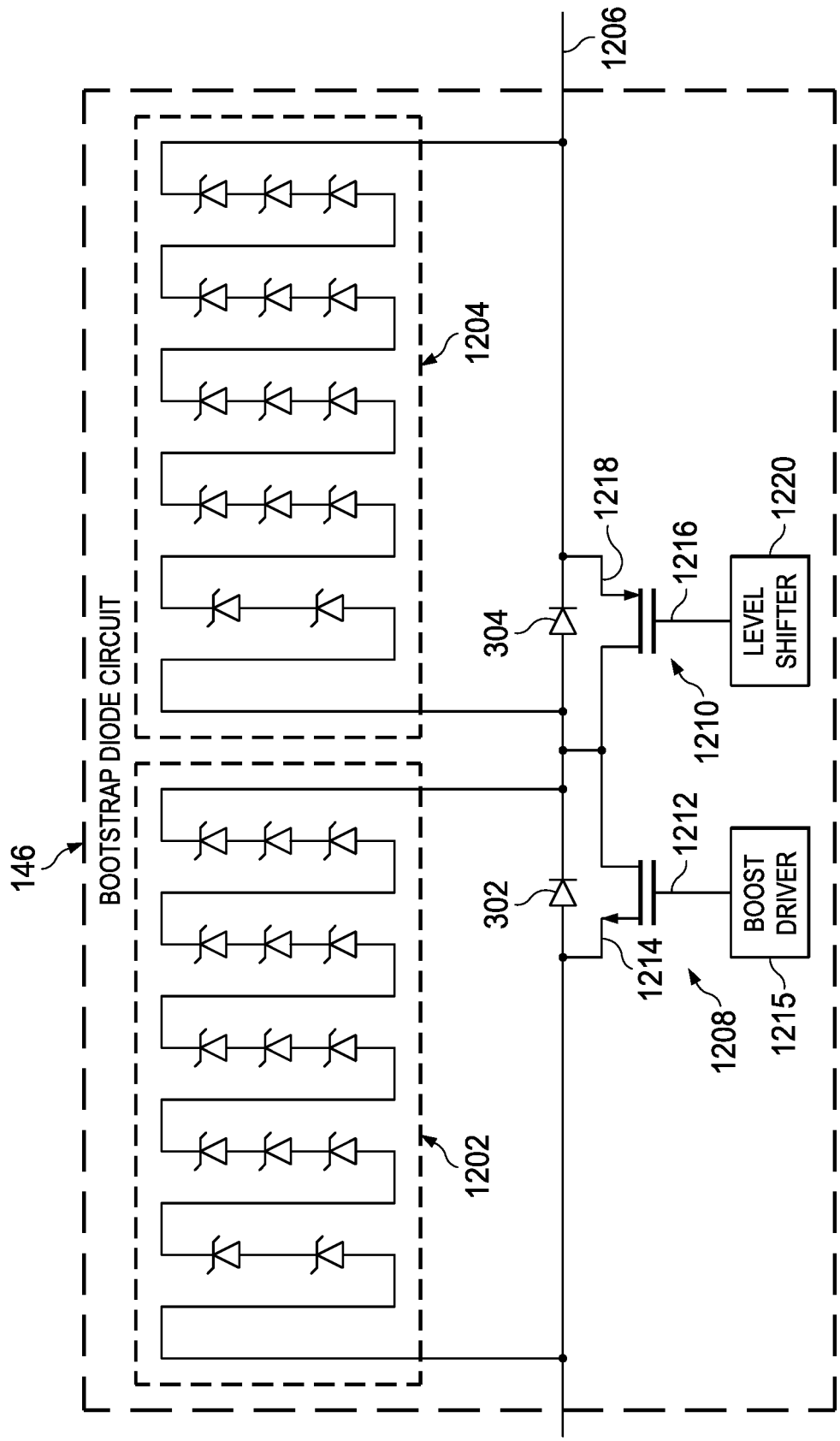
FIG. 12 is a schematic diagram of a ninth example circuit to implement the bootstrap diode circuit of FIGS. 1 and 2 having an example first diode coupled in series with an example second diode, an example first plurality of zener diodes, an example second plurality of zener diodes, an example N-MOSFET driven by an example boost driver circuit and also having an example P-MOSFET coupled to a level shifter circuit.

In some examples, the example bootstrap diode circuit 146 of FIG. 1 includes an example first diode 302 coupled in series with an example second diode 304, an example first plurality of series-coupled zener diodes 1202, and an example second plurality of series-coupled zener diodes 1204, as illustrated in the schematic FIG. 12. The first plurality of zener diodes 1202 is coupled in parallel with the first diode 302 and the second plurality of zener diodes 1204 is coupled in parallel with the second diode 304. In some such examples, the first and second pluralities of zener diodes 1202, 1204 clamp the voltage experienced across the first diode 302 and the second diode 304, respectively, to a maximum voltage level thereby reducing the risk that either the first and/or the second diodes 302, 304 experience breakdown when exposed to the reverse bias voltage appearing at the output 1206 of the bootstrap diode circuit 146. In some examples, the first diode 302 is also coupled in parallel with an example N-MOSFET 1208 and the second diode 304 is also coupled in parallel with an example P-MOSFET 1210. In some such examples, a level of voltage supplied to an example gate terminal 1212 of the N-MOSFET 1208 is positively biased relative to a level of voltage supplied to an example source terminal 1214 of the N-MOSFET 1208. As a result, the N-MOSFET 1208 turns ON causing the first diode 302 to be shunted. Thus, there is no forward voltage drop across the first diode 302 when current is flowing through the bootstrap diode circuit 146 toward the example bootstrap capacitive circuit 148 (see FIG. 1). In some examples, the bias voltage is supplied by a boost driver 1215 described further below in connection with FIG. 13. In some examples, a level of voltage supplied to an example gate terminal 1216 of the P-MOSFET 1210 is negatively biased relative to a level of voltage supplied to an example source terminal 1218 of the P-MOSFET 1210. As a result, the P-MOSFET 1210 turns ON causing the second diode 304 to be shunted. Thus, there is no forward voltage drop across the second diode 304 when current is flowing through the bootstrap diode circuit 146 toward the example bootstrap capacitive circuit 148 (see FIG. 1). A level shifter 1220 is used to shift the bias voltage supplied to the P-MOSFET to a level commensurate with the high voltage levels seen on the high side of the gate driver circuit 108. The level-shifter can be implemented using integrated 200V capacitors to shift an input signal from low-voltage to high-voltage without the need of 200V MOSFETs.

Figure 13:
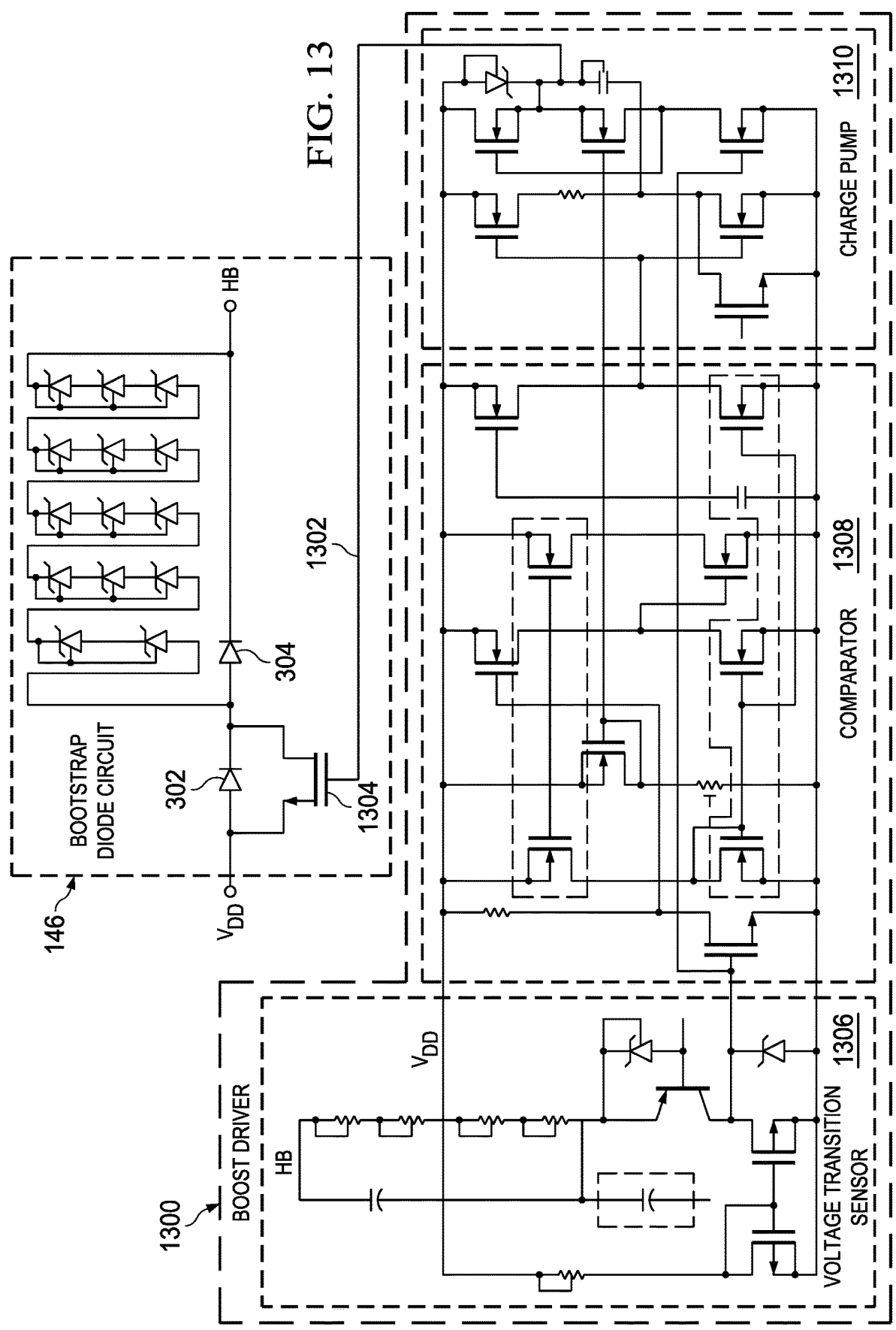
FIG. 13 is a schematic diagram of an example boost driver to drive an example N-MOSFET included in the implementations of the bootstrap diode circuit illustrated in FIGS. 7, 9, 10, 11 and 12.

In some examples, an example boost driver 1300 illustrated in the schematic diagram of FIG. 13 is coupled to the provide an example biasing voltage at an example gate terminal 1302 of an example N-MOSFET 1304 coupled in a series with a first diode 302 of the bootstrap diode circuit 146. The boost driver 1300, which is configured to be included on the same integrated circuit as the gate driver circuit (see FIG. 1 and FIG. 2) and the bootstrap diode circuit (See FIGS. 1-12), can similarly be used to supply power to the example gate terminal 706 of the example N-MOSFET 702 of FIG. 7, the example gate terminal 906 of the example N-MOSFET 904 of FIG. 9, the example gate terminal 1010 of the example N-MOSFET 1006 of FIG. 10, the example gate terminal 1110 of the example N-MOSFET 1106 of FIG. 11, and/or the example gate terminal 1212 of the example N-MOSFET 1208 of FIG. 12. In some examples, the boost driver 1300 includes an example voltage transition sensor 1306, an example comparator 1308, and an example charge pump 1310. The voltage transition sensor 1306 is coupled to sense the voltage at the example output HB 147 (see FIG. 1) of the example gate driver 108 (see FIG. 1) and includes the circuitry depicted in FIG. 13. In some examples, the voltage at the output HB 147 (see FIG. 1) is sensed by the voltage transition sensor 1306 and the associated current is limited using, for example, resistors. In some examples, the comparator 1308 is implemented using the circuitry depicted in FIG. 13 and compares the voltage sensed at the output HB 147 (see FIG. 1) to a fixed reference voltage (e.g., VDD 134) to determine if the voltage at the output HB 147 is high or low. If the voltage at output HB 147 is high (e.g., a reverse bias voltage is present at the output HB 147), the comparator 1308 quickly sends a signal to the charge pump 1310 which responds by shorting capacitor in the charge pump 1310 to thereby turn OFF the N-MOSFET 1304. In some examples, the voltage transition sensor 1306 and the comparator 1308 are configured to rapidly turn off the N-MOSFET 1304 to prevent the example second diode 304 from experiencing breakdown that might otherwise occur when the output HB 147 reaches 200V at a rapid slew rate. If the voltage at the output HB 147 (see FIG. 1) goes low, the comparator 1308 includes a timer feature such that, after a desired threshold amount of time, the charge pump 1310 supplies a bias voltage (e.g., VDD+ 5V) to the gate terminal 1302 of the N-MOSFET 1304 thereby causing the gate terminal to be 5V higher than a voltage at a source terminal 1312 of the N-MOSFET 1304. The use of the timer feature prevents the inadvertent turn ON of the N-MOSFET 1302 due to noise or extremely fast switching. In some examples, the charge pump 1310 includes the circuitry depicted in FIG. 13.

Figure 14:
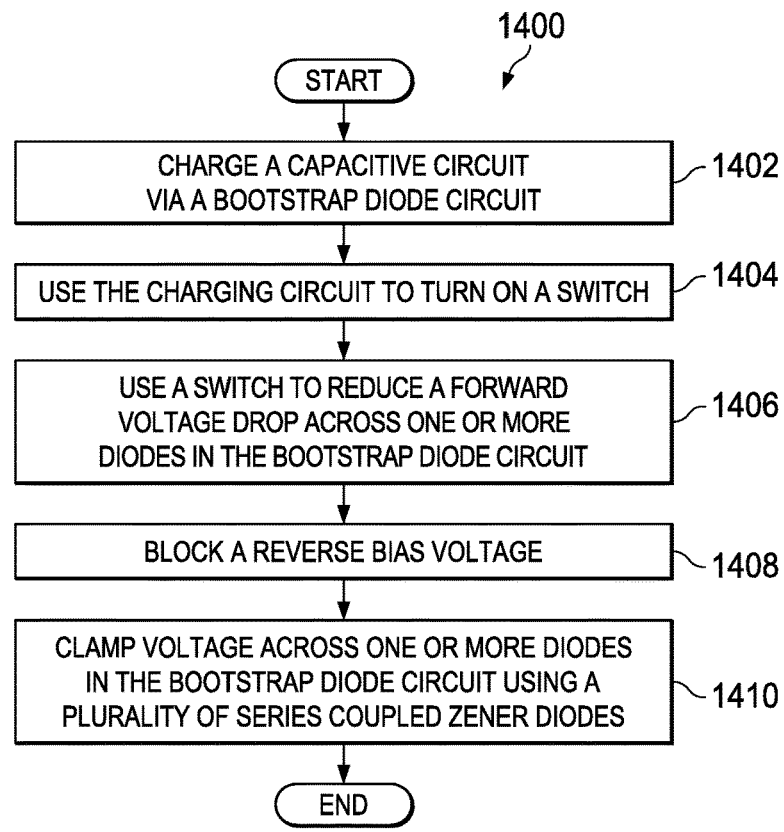
FIG. 14 is a flowchart representative of an example method which may be performed by the example gate driver circuit of FIG. 1, the example bootstrap diode circuit of FIGS. 1-12 and the boost driver of FIG. 13.

An example method 1400 that may be performed by the example gate driver circuit 108 (see FIG. 1), the example bootstrap diode circuit 146 (see FIG. 1-13) and the example boost driver 1300 (see FIG. 13) is represented by the flowchart shown in FIG. 14. With reference to the preceding figures and associated written descriptions, the example method of FIG. 14 begins at a block 1402 at which the example low voltage power supply VDD 134 (see FIG. 1) charges the example capacitive circuit 148 (see FIG. 1) via the example bootstrap diode circuit 146 (see FIGS. 1-13). As described above, the charging of the capacitive circuit 148 occurs when the example gate driver circuit 108 operates to turn an example first MOSFET Q1 110 OFF and an example second MOSFET Q2 112 ON. In some examples, a switch implemented using the example N-MOSFET X of FIG. X is coupled in parallel with the first example diode or the second example diode of the bootstrap diode circuit and operates to reduce the forward voltage drop across the first and/or second diode (see block 1406). In some examples, the switch reduces the forward voltage drop by turning ON thereby causing the charging current to bypass the first and/or the second diode.

When the example gate driver circuit 108 drives the example output HO 122 to a logic high and the example output LO 144 to a logic low, the second MOSFET 112 turns OFF and, provided that the capacitive circuit 148 is sufficiently charged, the first MOSFET Q1 110 turns ON (see block 1404). When the first MOSFET Q1 110 turns ON, a reverse bias voltage applied at an example output HB 147 of the bootstrap diode circuit 146 is blocked by the example first diode 302 (see FIG. 3) coupled in series with the example second diode 304 (see FIG. 3) (see block 1408). In some examples, an example first plurality of series-coupled zener diodes and/or an example second plurality of series coupled zener diodes operate to clamp the voltage across the first diode and/or the second diode (see block 1410).

Figure 15:
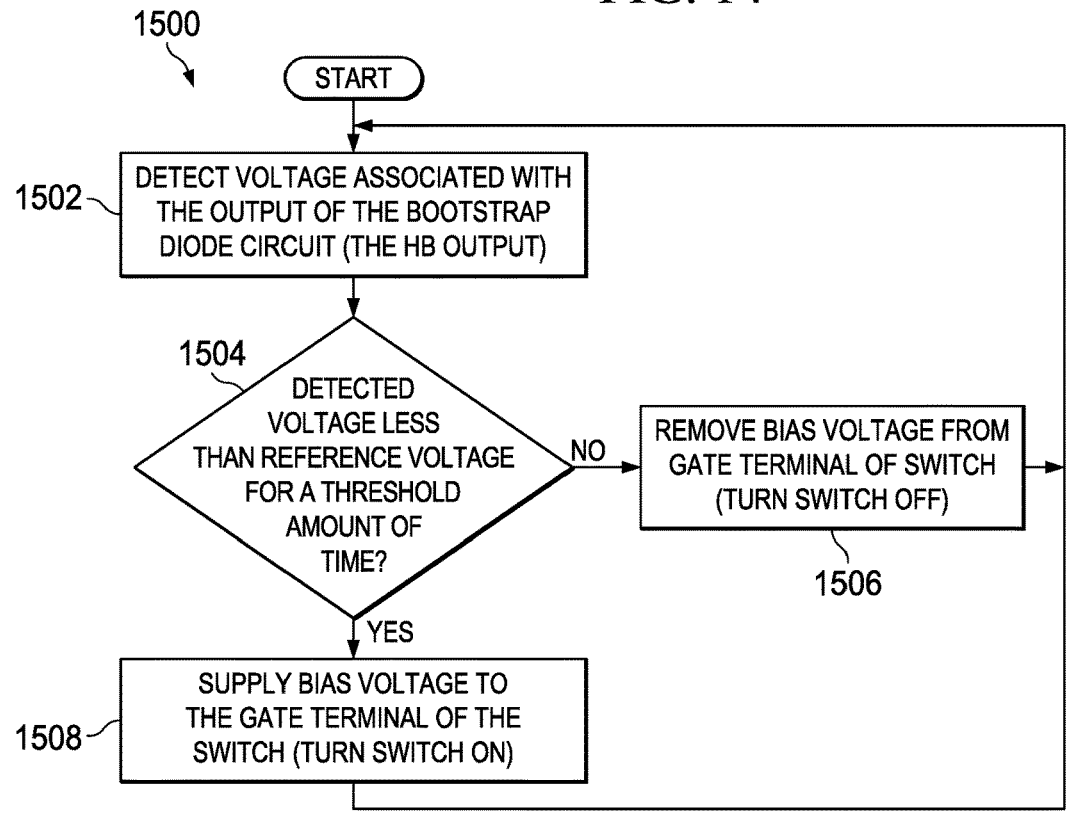
FIG. 15 is a flowchart representative of an example method which may be performed by the example boost driver circuit of FIG. 13, the example bootstrap diode circuit of FIGS. 1-12 and the boost driver of FIG. 13.

An example method 1500 that may be performed by the example boost driver circuit 1300 (see FIG. 13) is represented by the flowchart shown in FIG. 15. With reference to the preceding figures and associated written descriptions, the example method of FIG. 15 begins at a block 1502 at which the example voltage transition sensor 1306 senses a voltage associated with the output HB 147 (see FIG. 1). The voltage transition sensor 1306 supplies the detected voltage information to the example comparator circuit 1308 which compares the detected voltage to a reference voltage (e.g., VDD) (see block 1504). When the detected voltage exceeds the reference voltage (e.g., VDD), the comparator circuit 1308 notifies the example charge pump circuit 1310 (see FIG. 13) which responds by removing a bias voltage from the example gate 1302 of the switch (e.g., the example N-MOSFET) coupled in parallel with the first diode 302 (see block 1506). Removal of the bias voltage causes the switch to turn OFF. When the comparator circuit 1308 determines that the detected voltage at the output HB 147 has dropped below the reference voltage (e.g., VDD) for a threshold amount of time (see block 1504), the comparator circuit 1308 notifies the charge pump which responds by supplying the bias voltage to the gate terminal 1302 of the N-MOSFET thereby causing the N-MOSFET to turn ON (see block 1508). As described above, when the N-MOSFET is turned on, the forward voltage drop that would otherwise occur across the first diode 302 (see FIG. 13) is reduced and/or eliminated. In some examples, the bias voltage is equal to the voltage supplied by the low voltage power supply VDD 134 plus 5V.

Bootstrap circuits, configured in the manner disclosed above, provide many benefits. For example, the bootstrap diode circuits described herein can be used to block reverse bias voltages that exceed the reverse bias voltage ratings of individual diodes included in the circuits. In some examples, the disclosed bootstrap diode circuits can block a maximum reverse bias voltage of 200V using fast diodes rated for 100 V to implement the first diode 302 (see FIG. 3) and the second diode 304 (see FIG. 3). In some examples, the disclosed bootstrap diode circuits can block a reverse bias voltage that is twice and even four times larger than the reverse bias voltage rating of the first and second diodes. The disclosed bootstrap diode circuits can block a reverse bias voltage having a magnitude that is equal to or less than a maximum junction voltage of an integrated circuit on which the associated switching device is disposed. Additionally, the disclosed bootstrap diode circuits are configured to have a low forward voltage drop across the bootstrap diode circuit thereby making it easier to charge the capacitor that is used to bias the high side MOSFET.

As an additional benefit, the bootstrap diode circuits disclosed herein can be used to switch a high voltage power supply of 200V without requiring expensive fast diodes rated to withstand 200V diodes. As a result, existing single-chip gate driver circuits having fast diodes rated to withstand 100V configured in the manners disclosed herein can be used with applications involving high voltage power supplies on the order of 200V without the need to couple external fast 200V diodes to the integrated chips.

Modifications are possible in the described embodiments, and other embodiments are possible, within the scope of the claims.

What is claimed is:

1. A switch controller comprising:
   a first switch having a first reverse bias voltage rating;
   a second switch having a second reverse bias voltage rating;
   a gate driver circuit configured to control the first switch and the second switch, the gate driver circuit including a diode circuit, wherein the diode circuit includes a first diode and a second diode coupled in series, the diode circuit is configured to:
   block a reverse bias voltage having a magnitude that exceeds the first reverse bias voltage rating of the first diode and exceeds the second reverse bias voltage rating of the second diode; and reduce a first portion of the reverse bias voltage across the second diode with respect to a second portion of the reverse bias voltage across the first diode, the first portion greater than the second portion; and the diode circuit further including:
a first plurality of zener diodes coupled in series, the first plurality of zener diodes coupled in parallel with the second diode; and
a second plurality of zener diodes coupled in series, the second plurality of zener diodes coupled in parallel with the first diode.

2. The switch controller in claim 1, wherein the magnitude of the reverse bias voltage is larger than twice the first reverse bias voltage rating and larger than twice the second reverse bias voltage rating.

3. The switch controller in claim 1, wherein the reverse bias voltage is applied to the output of the second diode and an area occupied by the second diode is six times greater than an area occupied by the first diode.

4. The switch controller in claim 1, wherein the reverse bias voltage is applied to an output of the second diode.

5. The switch controller in claim 1, wherein the reverse bias voltage is applied to an output of the second diode, and the diode circuit further includes a MOSFET coupled in parallel with the first diode.

6. The switch controller in claim 5, wherein the diode circuit further includes a boost driver circuit, the boost driver circuit including:
a voltage sensing circuit to sense a gate driving voltage at an output of the gate driver circuit;
a comparator circuit to compare the sensed gate driving voltage to a reference voltage; and
a charge pump circuit to turn on the MOSFET coupled in parallel with the first diode based on the comparison made by the comparator circuit.

7. The switch controller in claim 1, wherein the diode circuit further includes a first MOSFET coupled in parallel with the first diode and a second MOSFET coupled in parallel with the second diode.

8. The switch controller in claim 7, wherein the first MOSFET and the second MOSFET are N-MOSFETS.

9. The switch controller in claim 7, wherein the first MOSFET is an N-MOSFET and the second MOSFET is a P-MOSFET.

10. The switch controller in claim 1, wherein the diode circuit further includes a first MOSFET coupled in parallel with the first diode, a second MOSFET coupled in parallel with the second diode, and a voltage limiting circuit coupled between a gate of the first MOSFET and a source of the first MOSFET, the voltage limiting circuit including a zener diode coupled in series with a resistor.

11. The switch controller in claim 1, wherein the diode circuit further includes a level shifter to shift an input voltage supplied to the gate driver circuit from a first voltage level to a second voltage level.

12. A method comprising:
charging a charging device coupled to a switching device;
delivering charge to the switching device from the charging device, to cause a reverse bias voltage to be applied to a bootstrap diode circuit, the bootstrap diode circuit including:
first and second diodes coupled in series, a first plurality of zener diodes coupled in series, and a second plurality of zener diodes coupled in series, wherein:
the first diode and the second diode include respective reverse bias voltage ratings;
the first plurality of zener diodes is coupled in parallel with the first diode; and
the second plurality of zener diodes is coupled in parallel with the second diode;
clamping, with the first plurality of zener diodes, the voltage across the first diode to a magnitude less than or equal to the reverse bias voltage rating of the first diode;
clamping, with the second plurality of zener diodes, the voltage across the second diode to a magnitude less than or equal to the reverse bias voltage rating of the second diode; and
blocking, with the first and second diodes, the reverse bias voltage, the magnitude of the reverse bias voltage exceeding the respective reverse bias voltage ratings of the first diode and the second diode.

13. A switch controller comprising:
a first switch having a first reverse bias voltage rating;
a second switch having a second reverse bias voltage rating; and
a gate driver circuit configured to control the first switch and the second switch, the gate driver circuit including a diode circuit, wherein the diode circuit includes:
a first diode and a second diode coupled in series;
a first plurality of zener diodes coupled in series, the first plurality of zener diodes being coupled in parallel with the second diode; and
a second plurality of zener diodes coupled in series, the second plurality of zener diodes being coupled in parallel with the first diode; and wherein the diode circuit is configured to block a reverse bias voltage applied to an output of the second diode, the reverse bias voltage having a magnitude that exceeds the first reverse bias voltage rating of the first diode and exceeds the second reverse bias voltage rating of the second diode.

14. A switch controller comprising:
a first switch having a first reverse bias voltage rating;
a second switch having a second reverse bias voltage rating; and
a gate driver circuit configured to control the first switch and the second switch, the gate driver circuit including a diode circuit, wherein the diode circuit includes:
a first diode and a second diode coupled in series; and
a first MOSFET coupled in parallel with the first diode;
a second MOSFET coupled in parallel with the second diode; and
a voltage limiting circuit coupled between a gate of the first MOSFET and a source of the first MOSFET, the voltage limiting circuit including a zener diode coupled in series with a resistor; and wherein the diode circuit is configured to block a reverse bias voltage having a magnitude that exceeds the first reverse bias voltage rating of the first diode and exceeds the second reverse bias voltage rating of the second diode.

* * * * *